United States Patent [19]

Forsyth et al.

[11] Patent Number: 4,910,458

[45] Date of Patent: Mar. 20, 1990

[54] ELECTRO-OPTIC SAMPLING SYSTEM WITH DEDICATED ELECTRO-OPTIC CRYSTAL AND REMOVABLE SAMPLE CARRIER

[75] Inventors: Keith W. Forsyth, Philadelphia, Pa.; Philippe Bado, Rush, N.Y.

[73] Assignees: Princeton Applied Research Corp., Princeton, N.J.; University of Rochester, Rochester, N.Y.

[21] Appl. No.: 29,835

[22] Filed: Mar. 24, 1987

[51] Int. Cl.$^4$ .................. G01R 31/28; G01R 19/00
[52] U.S. Cl. .................. 324/158 R; 324/77 K; 324/96; 324/158 F
[58] Field of Search .................. 324/158 R, 96, 77 K, 324/95, 158 F; 250/356, 374, 376; 356/368

[56] References Cited

U.S. PATENT DOCUMENTS 4,446,425  5/1984  Valdmanis et al. .................. 324/96
4,603,293  7/1986  Mourou et al. .................. 324/96
4,681,449  7/1987  Bloom et al. .................. 324/77 K

OTHER PUBLICATIONS

Valdmanis et al.; "Electro-Optic . . . "; Laser Focus-/Electro-Optics; Feb. 1986; pp. 84–86,88,90,92,94,96.
Valdmanis et al.; "Electro-Optic . . . "; Laser Focus-/Electro-Optics; Mar. 1986; pp. 96–98, 100, 102, 104, 106.
White et al.; "Travelling Wave . . . "; Opt. Commun.; 5; 374–379; (1972).

Primary Examiner—Ernest F. Karlsen
Attorney, Agent, or Firm—Robert P. Cogan

[57] ABSTRACT

An electro-optic sampler utilizes a Pockels cell comprising an electro-optic crystal and a separate, removable sample carrier having an electrical transmission line affixed thereto to provide an electric field accessible to the optical sampling pulses. In the present system, a device under test is bonded to the removable sample carrier. The electro-optic crystal is not bonded to the carrier. Rather, means are provided for the electro-optic crystal to releasably engage the sample carrier and its affixed electrical transmission lines. Upon completion of a test, the carrier may be removed from the system with the device-under-test affixed thereto, and the same electro-optic crystal may be utilized in conjunction with another removable sample carrier having another device under test affixed thereto.

7 Claims, 4 Drawing Sheets

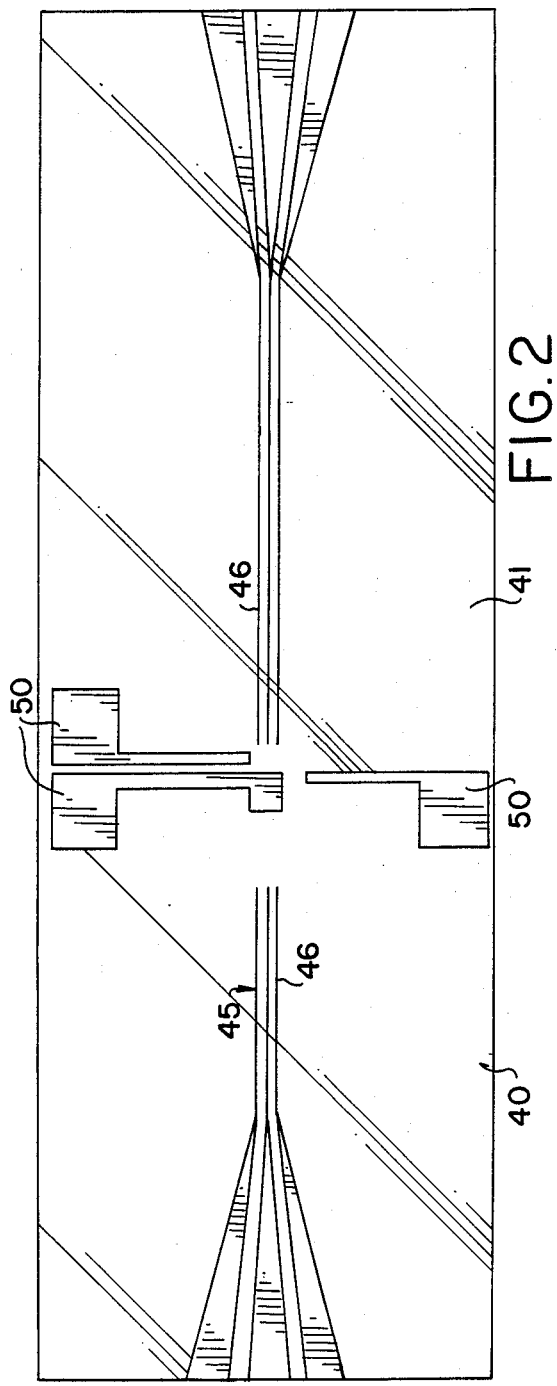
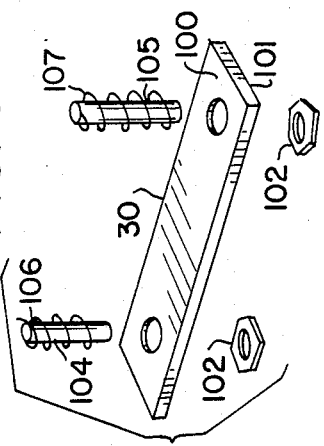

ELECTRO-OPTIC SAMPLING SYSTEM WITH DEDICATED ELECTRO-OPTIC CRYSTAL AND REMOVABLE SAMPLE CARRIER

BACKGROUND OF THE INVENTION

The present invention relates to systems for electro-optic sampling of electrical signals being analyzed and to improved construction of Pockels cells included therein.

An electro-optic sampler is especially suitable for measurement of picosecond transient signals such as those produced by photodiodes, integrated circuits and other fast devices which either have an electrical stimulus and electrical output or which have an optical stimulus and an electrical output. Where the charactertics of the system are known the electrical characteristics of a device-under-test can be measured.

Electro-optic sampling systems of the type contemplated within the text of the present invention utilize Pockels cells. A Pockels cell comprises what is referred to in the present specification as an electro-optic crystal which has the property of variable birefringence as a function of electrical field applied thereto. This effect was described in F. Pockels, *Lehrbuch der Kristalloptic*, (Teubner, Leipzig, 1906). The electro-optic crystal is an expensive element of an electro-optic sampler. In accordance with the present invention, usability and reusability of electro-optic crystals is faciliated so that availability of use of electro-optic sampler can be expanded.

The electro-optic crystal is utilized in the following context. An optical pulse train is provided from a source and split into two different paths, a sampling beam and stimulus beam. One such source is a visible wavelength picosecond laser. Optical pulses in the first path trigger generation of the electrical signal to be measured. This electrical signal is coupled to be accessible to the electro-optic crystal, through which optional sampling pulses of the second path are propagated. The crystal is in an optical path between first and second crossed polarizers. The field-induced birefringence varies the polarization of the sampling beam. The sampling beam intensity after polarization analysis is measured by a detector, e.g. a slow photodiode, one which does not have to resolve individual pulses.

The detector output is provided to utilization means. Electrical output from the detector as well an electrical output indicative of modulation of pulses in the stimulus beam are first coupled to a lock-in amplifier which yields a DC output proportional to the amplitude of the sampled electrical signal in phase with the modulation of the stimulus beam. A display can be generated by plotting the output of the lock-in amplifier during successive pulse periods against the output of a variable delay line synchronized with the display device. The basic theory of electro-optic sampling is explained in J. A Valdmanis and G. Mourou, "Electro-Optic Sampling: Testing Picosecond Electronics", Laser Focus/Electro-Optics, February, 1986, Page 84 and J. A. Valdmanis, G. A. Mourou, and C. W. Gabel, IEEE Journal of Quantum Electronics, Volume QE-19, 4, Apr. 1983, p. 664. An effective electro-optic sampler for measuring signals having temporal components on the order of picoseconds is disclosed in U.S. Pat. No. 4,446,425 issued on May 1, 1984 to J. A. Valdmanis and G. Mourou.

In the most common implementation of electro-optic sampling, the electro-optic sampler is embodied in a test fixture composed of three parts. These are a metal or ceramic carrier, a photoconductive switch and an electro-optic crystal. The carrier provides mechanical support for active devices. The active devices include the electro-optic crystal itself, the photoconductive switch and the device-under-test. The photoconductive switch is typically a chip of GaAs a few millimeters square with a metallic wave guide of sub-millimeter dimensions deposited on surfaces thereof. The photoconductive switch is attached with adhesive to one end of the carrier. The electro-optic crystal may typically comprise lithium tantalate and has a transmission line such as a waveguide deposited on its surfaces. It is attached to the other end of the carrier with an adhesive. The device-under-test is attached to the carrier, also with adhesive, between the switch and the crystal. Electrical connections are made from the device-under-test to the wave guides on the switch and on the crystal as well as to a bias network typically with gold wire bonds. In the operational mode, the photoconductive switch has appropriate bias applied thereto. When it is stimulated with the stimulating beam described above, an electrical pulse with picosecond risetime is launched down the waveguide. This is the stimulus signal which stimulates or turns on the device-under-test. The device-under-test produces an electrical output pulse which is then launched down the waveguide on the crystal surface where its electrical field affects the birefringence of the electro-optical crystal and is sampled by the second train of optical pulses.

A problem arises when testing is complete and another device is to be tested. The device-under-test generally cannot be removed from the fixture without destroying the electro-optic crystal since the materials involved, typically lithium tantalate are fragile. Removal of the wire bonds from the waveguides on the electro-optic crystal could severely damage these waveguides. Adhesion to crystal surfaces can qualitatively be described as only being fair. Bearing in mind the fragility, very small size and cost of rework on the electro-optic crystal in particular frequent replacement of electro-optic crystals is not feasible for most users.

Prior schemes which have been proposed to avoid these problems involve the principal of eliminating the permanent physical connection between the device-under-test and a separate electro-optic crystal. These methods require that the crystal be brought within a few microns of the device-under-test. If the crystal touches either the substrate or device-under-test with more than a minimal amount of force, e.g. ten grams, either would likely be destroyed. Another proposed solution is the fabrication of the device-under-test on a substrate exhibiting a Pockels effect, using the device/substrate itself as the electro-optic crystal this allows non contact probing, but without the sensitivity, calibration and position control problems of other non-contact schemes. This technique is not useful with respect to silicon devices since silicon does not exhibit the Pockels effect.

Another approach that has been considered by some is the use of connectors to permit insertion and removal of the device-under-test from the signal path. No commercial connector currently available has a bandwidth beyond 50 GHz, and it appears that extending this mode-free bandwidth almost an order of magnitude is unlikely. Even coplanar waveguides of sub-millimeter dimensions have sufficient dispersion to increase the risetime of a one picosecond signal to about ten picoseconds after less than five millimeters of propagation distance. Waveshape distortion accompanies this effect. Another variation of a non-contact concept utilizes a thin electro-optic crystal with a dielectric, high reflection coating on its bottom surface placed near or in contact with the top of the coplanar output waveguide. Electric field propagating down the waveguide penetrates the crystal, and sampling pulses reflected from the bottom surface are used to make the measurement. This technique avoids many of the problems mentioned above but continues to suffer the disadvantages of requiring sophisticated positioning apparatus. This also requires use of the reflection mode. As further described below, it is desirable to be able to use either a reflection mode or transmission mode. In accordance with the present invention, it is desirable to provide for repetitive measurements of devices-under-test with the use of a single electro-optic crystal which may be dedicated to a particular test system.

SUMMARY OF THE INVENTION

It is therefore the object of the present invention to provide in an electro-optic sampler a reusable electro-optic crystal.

It is also an object of the present invention to provide an electro-optic sampling system and method incorporating a readily reusable electro-optic crystal cooperating with a removable sample carrier.

It is a more specific object of the present invention to provide an electro-optic sampler system of the type described in which electrical transmission line means providing an electrical signal for access to an optical sampling pulse are formed on a carrier member and not on the electro-optic crystal.

It is also a general object of the present invention to provide an electro-optic sampler and subassemblies therefor utilizing a method in which an electro-optic crystal is not affixed to electrical transmission lines, providing for simple, rapid and inexpensive repetitive testing.

It is another general object of the present invention to provide a simplified electro-optic sampler low in cost to use compared to prior electro-optic samplers whereby the utility of electro-optic samplers is made available for a far wider range of users.

It is also an object of the present invention to provide an electro-optic sampler and subsystems therefore capable of operating in the reflective or transmissive mode.

It is another more specific object of the present invention to provide a sampler of the type described in which a device-under-test is affixed to a sample carrier means incorporating electrical transmission line means which sample carrier means is removable from the apparatus.

Briefly stated, in accordance with the present invention, there is provided an electro-optic sampler and subsystems therefore in which removable sample carrier means are provided on which are formed electrical transmission line means for coupling an electrical signal for accessibility to be sampled by an optical pulse, electro-optic crystal and holder means adapted to be brought into and out of engagement selectively with a carrier. After a measurement is made, the carrier and device-under-test may be removed and archived. In another form, a glass carrier may have durable gold transmission lines formed thereon so that it may be reused with each of a plurality of devices-under-test. The electro-optic crystal may be reused.

BRIEF DESCRIPTION OF THE DRAWINGS

The means by which the foregoing objects and features of invention are achieved are pointed out with particularity in the claims formed in the concluding portion of the specification. The invention, both as to its organization and manner of operation may be further understood by reference to the following description taken in connection with the following drawings.

Of the drawings:

FIGS. 1a and 1b are partial details of FIG. 1 illustrating alternative embodiments;

FIG. 2 is a plan view of a sample carrier for use in the present invention;

FIGS. 4 and 5 are plan and elevation views respectively of a lower half of a test figure for incorporating the present invention;

FIG. 8 is an axonometric view of holder means holding an electro-optic crystal.

DESCRIPTION OF THE PREFERRED EMBODIMENTS

Figure 1:
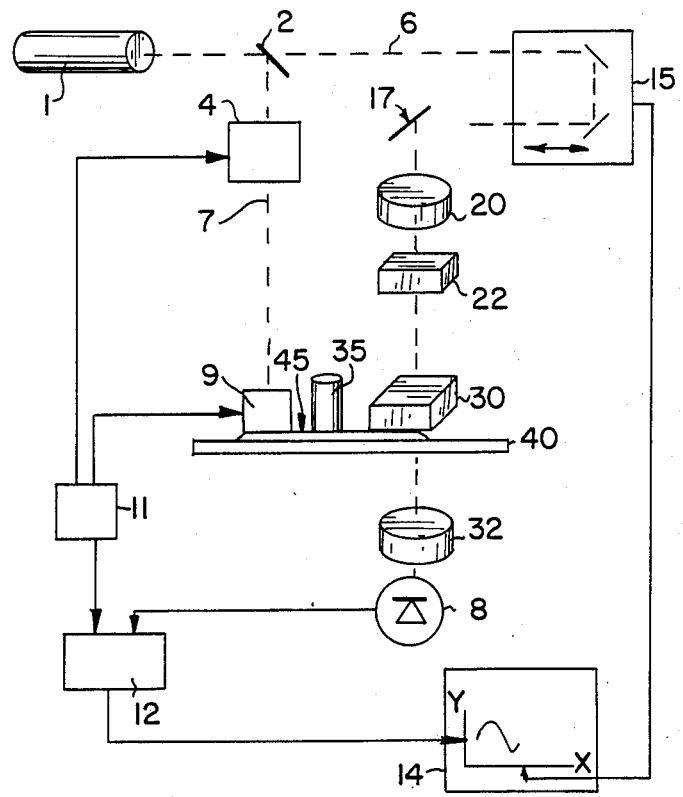
FIG. 1 is a partially schematic and partially block diagrammatic representation of an electro-optic sampling system in which the improvement of the present invention may be utilized.

In FIG. 1, a system and components therefor in accordance with the present invention are illustrated partially in schematic and partially in block diagrammatic form. This illustration includes components also further described in subsequent figures in which the same reference numerals are utilized to denote corresponding components. A laser source 1 provides a train of optical pulses to a beam splitter 2 which divides the optical pulse train into a first, optical sampling pulse train 6 and a second, stimulus pulse train 7. A "slow" photodiode 8 receives the resulting pulses indicative of the sampled signal and a stimulator 9, which may also be called a photoconductive switch 9, produces electrical pulses in response to the stimulus optical pulse train 7. A modulator 11 is coupled for modulating the electrical pulse train from stimulator 9, either by direct electrical input or by an optical modulation means 4 for modulating the stimulus beam impinging upon stimulator 9. The diode 8 and modulator 11 are connected to a lock-in amplifier 12 which operates in a prior art manner to provide a direct current amplitude output proportional to the output of the diode 8 in phase with the output of the modulator 11. The output of the lock-in amplifier 12 may be coupled to utilization means 14 which may provide a recording and/or display of the sampled signal. The time axis of the utilization means 14 may be driven by an input supplied thereto by a variable optical delay means 15 optically coupled in the sampling pulse train 6 to respond to unmodified pulses from the source 1 and providing an electrical output to the utilization means 14, again in a prior art manner as described in the above-cited references.

The sampling optical pulse train 6 is directed through the variable delay means 15 and directed by mirror means 17, which is optional, through a polarizer 20 and a birefringent compensator 22. The sampling pulses in the optical pulse train 6 sample an electrical signal to be sensed when next passing through an electro-optic crystal 30, which may be any crystal known by prior art means to manifest to the Pockels effect, such as lithium tantalate. The sampling pulses are then directed through an analyzer 32 to a diode 8. The diode 8 may comprise two diodes in a differential configuration. In FIG. 1, the dotted line is schematic and does not represent the only necessary path for the sampling pulse train 6. The electro-optic crystal 30 may operate in the transmissive mode wherein the pulse train 6 proceeds in a straight line through the crystal 30. In an alternative embodiment, the representation of FIG. 1 represents an embodiment in which a surface or surfaces of the electro-optic crystal 30 are made reflective. The sampling optical pulse train 6 enters the crystal 30, and is reflected therefrom to the analyzer 32. In the reflective mode the analyzer 32 may comprise the polarizer 20. In such an embodiment, the analyzer 32 and polarizer 20 are both on the same side of the electro-optic crystal 30, as seen in the partial detail of FIG. 1a.

Figure 3:
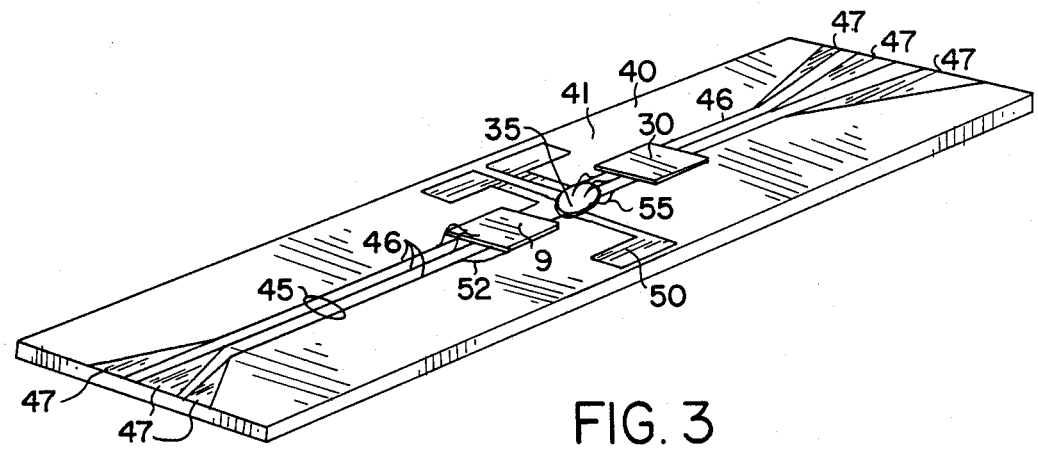
FIG. 3 is an axonometric view demonstrating spatial relationship of a sample carrier, photoconductive switch, electro-optic crystal and device-under-test.

Birefringence of the electro-optic crystal 30 will be affected by an electric field produced by a device-under-test 35. In accordance with the present invention, the device-under-test 35 and stimulator 9 are all supported to a carrier 40 while electro-optic crystal 30 is shown in its engaged state of releasable engagement. The carrier 40 and its relationship to the components it supports is further described and illustrated with respect to FIGS. 2 and 3 and well as FIG. 1. FIG. 2 is a plan view of the carrier 40, and FIG. 3 is an anoxometric view of the carrier 3 and its relationship to the above-described components supported thereto. The carrier 40 has electrical transmission lines means 45 affixed thereto.

Figure 9:
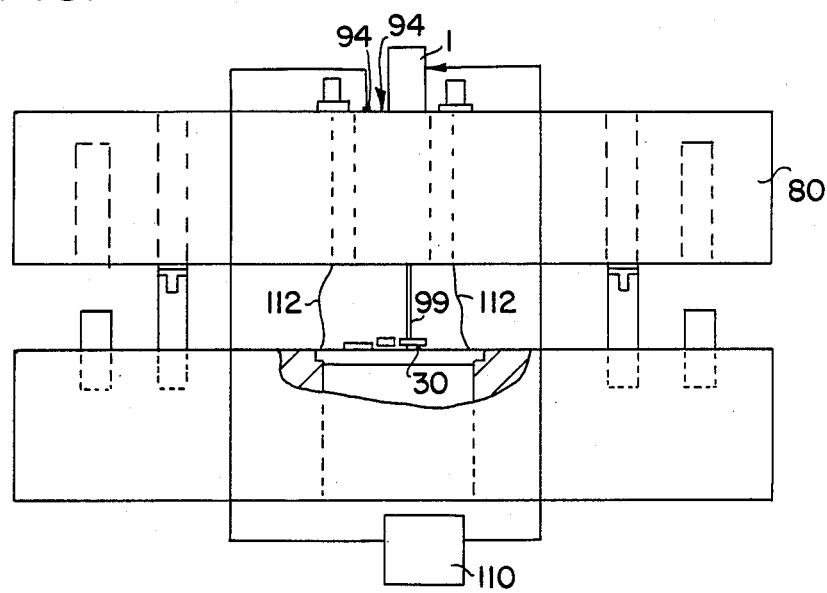
FIG. 9 is an elevation, partially broken away of a test system incorporating the present invention.

Electrical transmission line means 45 comprises parallel conducting lines 46 for coupling signals to the stimulator and from the device-under-test 35. The conductors 46 will be described as extending in a transverse direction. At opposite transverse ends of the carrier 40, the conductors 46 terminate at terminating portions 47 for connection to control electronics (FIG. 9). In a transversely central portion on the upper surface 41 of the carrier 40, laterally extending ohmic pads 50 extend for coupling biasing voltages to the device-under-test 35. The number and shape of the ohmic pads 50 is a function of the type or types of device or devices-under-test to be utilized. The stimulator, or photoconductive switch, 9 is affixed, as for example, with adhesives to the carrier 40. The carrier 40 may be glass. Gold bonding wires 52 or other means, bond the photoconductive switch 9 to a first run of the conductors 46. The switch 9 is connected to stimulate the device-under-test 35. The device-under-test has gold wire bonds 55 or other means connected to a separate portion of the conductor 46. The bonding wires 55 are intentionally kept short. In accordance with the present invention, electro-optic crystal 30 is placed on the carrier 40 and mechanically biased (by means further illustrated below) against the electrical transmission lines 45 and as close as practical to the device-under-test connections 55 so that optical pulses transmitted into the electro-optic crystal 30 will be affected by the field produced by the device-under-test 35.

When the photoconductive switch 9 is stimulated with a short light pulse in the stimulus train 7 from the laser 1, an electrical pulse with picosecond rise time is launched down the electrical transmission lines means 45. This is the signal which stimulates the device-under-test 35. In an alternative embodiment shown in FIG. 1b, which is a partial detail of FIG. 1, for measuring a light-stimulated device with electrical output, the stimulator 9 will comprise the device-under-test 35. The device-under-test 35 is directly stimulated by stimulus beam 7 to launch an electrical output to create a field to affect the crystal 30. Its birefringence is altered, and this alteration is sampled by the optical sampling pulse train 6. The degree of rotation of polarization caused thereby is sensed by the diode 8 in conjunction with the analyzer 32 to provide an electrical indication of the signal provided by the device-under-test 35. This is provided to utilization means from the lock in amplifier 12 in a prior art manner.

The carrier 40 comprises optical transmission means in registration with the electro-optic crystal 30 for transmission of the train of optical sampling pulses 6 therethrough when the crystal 30 is used in the transmissive mode. In utilization, the crystal 30 and carrier 40 are in the path of radiation of the sampling optical pulse train 6.

The crystal 30 is held in releasable engagement to the carrier 40 via mechanical biasing means further described with respect to FIGS. 8 and 9 below. When the system is utilized, the carrier and components supported thereby may assume the spatial relationship illustrated in FIG. 3. In accordance with the present invention, since the electrical transmission lines means 45 are formed on the carrier 40 and not on the crystal 30, the crystal 30 is readily releasable from the carrier 40. Since crystals 30 are both fragile and compared to other components in the system highly expensive, facilitating their reusability widens the scope of the practical use of electro-optic sampling. Where a crystal 30 can be used only once or twice, it can only be used in significant research applications. By making the crystal 30 reusable, it is more amenable to use in industrial contexts for characterizing devices under test such as gallium arsenide field effect transistors. After measurements are completed, and the crystal 30 removed from engagement with the carrier 40, the sample carrier 40 and device-under-test 35, as well a the photoconductive switch, or stimulator, 9 remain as a unit. The carrier 40 is removable from fixture means 45 described below. For future reference purposes, the removed carrier 40 with device-under-test 35 affixed thereto is readily archivable.

Figure 4:
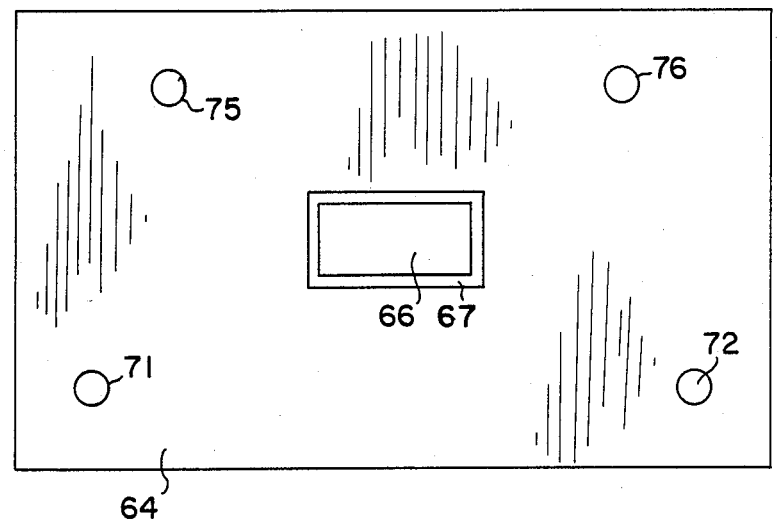
Figure 6:
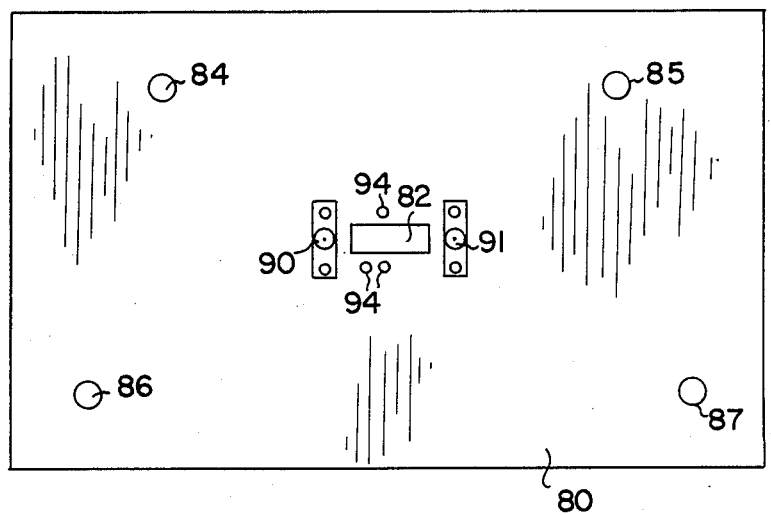
FIGS. 6 and 7 are respectively a plan and elevation view of a top portion of a test fixture.
Figure 7:
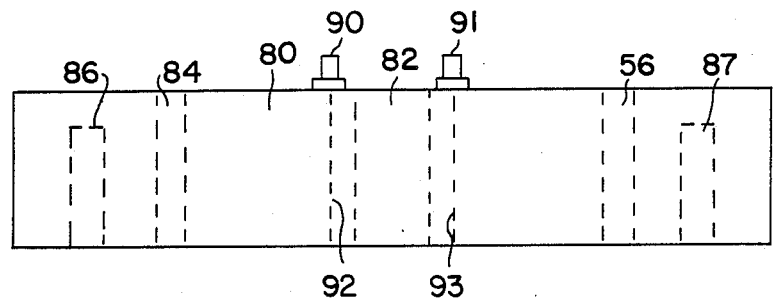

The test system further comprises a test system fixture having a bottom half illustrated in FIG. 4 and 5 in plan view and elevation view respectively which supports a top half illustrated in FIGS. 6 and 7 in plan view and elevation respectively. Support and mechanical biasing means for holding the electro-optic crystal 30 are illustrated in FIG. 8, which is an exploded axonometric view. FIG. 9 is a plan view, partially broken away, to illustrate a system constructed in accordance with the present invention.

The bottom section (FIGS. 4 and 5) consists of a platform 64 which may be constructed, for example, of Delrin. A central, vertically extending aperture 66 is provided for permitting light transmission therethrough. A recessed shoulder 67 comprising platform means is provided set into a top surface 68 of the block 64 for supporting a sample carrier 40 in registration with the aperture 66. First and second locator pins 71 and 72 are provided at transversely displaced portions of the block 64 for positioning the upper half of the fixture described below with respect to the block 64.

First and second hinged support pins 75 and 76 are provided for supporting the upper section described below and for providing for a first "open" position in which a cover member is lifted up and a second "closed" position in which a cover member is brought into engagement with the locator pins 71 and 72 to have a fixed position with respect to the block 64 and the sample carrier 40 when the sample carrier 40 is resting on the peripheral shoulder 67.

The above-referred to upper half comprises a cover block 80 having a central aperture 82 in registration with the aperture 66 in the closed position. Holes 84 and 85 of the block 80 receive uper portions of the hinged pins 75 and 76 respectively so that the block 80 is pivotally mounted to the base 64. Bores 86 and 87 are provided for interacting with the locator pin 71 and 72 so that when the apparatus is in the second or closed position, the pins 71 and 72 act as alignment means against the bores 86 and 87 respectively. Coaxial connector probes 90 and 91 respectively connected to through connection means 92 and 93 respectively are provided for connecting signals to the contact means 47 illustrated in FIG. 3. Connection means 94 also extend through the block 80 for other connections described below.

FIG. 8 illustrates means for mechanically biasing the crystal 30 to the sample carrier 40 when the apparatus is in the second or closed position. An optically transmissive plate 100 is provided having the crystal 30 affixed to a lower surface 101 thereof such as by an optical adhesive. Fastener means 102, such as nuts secure threaded spring-loaded support rods 104 and 105 to the crystal holder 100. The rods 104 and 105 are each surrounded by a spring 106 or 107 respectively. The rods 104 and 105 are fixed the block 80 and the springs 106 and 107 apply biasing force to the crystal holder 100. In an alternative form, vacuum chuck or other means may bias the crystal 30 against the sample carrier 40.

The entire assembly is shown in FIG. 9, which is an elevation of the apparatus in the second, closed position partially broken away to show a sample carrier 40 received in the aperture 66 and supported to the shoulder 67. Ohmic connections 112 are made from the connector means 92 and 93 to pads 47 on the sample carrier 40. The crystal biasing and support means 99 engages the crystal 30 in the position shown in FIG. 3. The laser 1 is mounted to project a beam in registration with the apertures 82 and 66 and an electronics package 110 comprising the further means illustrated in FIG. 1 as well as conventional signal generation means for coupling to the contacts 47 and 50 of FIG. 3 is provided as well. Ohmic contracts 111 couple connection means 94 in block 80 to pads 50 on the sample carrier 40. In the second position, the system operates as described with respect to FIG. 1. When it is desired to remove a sample carrier 40 and use the crystal 30 with another sample carrier 40, the block 80 is raised to the first, open position. Specifically, the cover member 80 is rotated about an axis in transverse registration with a line from the hinged pin 75 to the hinged pin 76, and the crystal biasing and support means 99 lift the crystal 30 out of engagement with the sample carrier 40. A new sample carrier 40 may be placed in the unit. Alternatively, a first sample carrier 40 may be reworked to remove the tested device and affix another device-under-test 35 thereto. Since transmission lines 45 can adhere more tenaciously to other materials affixed to the sample carrier for than they do to the fragile, electro-optic crystal 30, such a change can be reliable and relatively simple.

The above description has been written with a view toward enabling those skilled in the art to make many modifications to provide an apparatus and components therefore constructed in accordance with the present invention. The apparatus is operable in the transmissive or reflective mode. Other numbers of conductors may be provided for the electrical bias on the device-under-test and electrical transmission lines.

What is claimed as new and desired to be secured by Letters Patent of the United States is:

1. A Pockels effect electro-optic sampler including a traveling wave Pockels cell for electro-optically sampling successively occurring portions of an electrical signal with optical pulses which propagate through the cell, comprising: an electro-optic crystal comprising said Pockels cell, electrical transmission line means along which said electrical signal propagates to produce an electric field accessible to the optical sampling pulses which are propagated through said electro-optic crystal transversely to said electrical transmission line means, removable sample carrier means to which said electrical transmission lines means are affixed, and holder means for mechanically supporting said electro-optic crystal in releasable engagement with said removable sample carrier means, said removable carrier means comprising means for receiving a device-under-test.

2. An electro-optic sampler according to claim 1 wherein said optical pulses are provided through said electro-optic crystal in the transmissive mode and wherein said carrier means comprises transmission means in registration with said electro-optic crystal for providing sampling pulses therethrough.

3. An electro-optic sampler according to claim 1 wherein said electro-optic crystal comprises means for receiving and reflecting said electro-optic sampling pulses.

4. An electro-optic sampler according to claim 1 further comprising platform means for supporting said removable sample carrier means and wherein said holder means are pivotably mounted thereto, said holder means further comprising mechanical biasing means for urging said electrooptic crystal to said removable sample carrier means and comprising means for defining an engaged position of said holder means for maintaining said electro-optical crystal in engagement with said removable sample carrier means, and wherein said platform means comprises an aperture in registration with said electro-optic crystal and defining a path for the optical sampling pulses.

5. The system according to claim 4 further comprising a device-under-test affixed to said removable sample carrier means for providing a signal to said Pockels cell.

6. A system according to claim 5 wherein said device-under-test comprises an optically stimulated electrical emitter.

7. A system according to claim 5 wherein said device-under-test comprises an electrically stimulated electrical emitter and further comprising an optically stimulated electrical emitter coupled to said device-under-test for providing an electrical output to said electro-optic crystal.

* * * * *